(12) United States Patent
Xuan et al.

(10) Patent No.: US 10,985,222 B2
(45) Date of Patent: Apr. 20, 2021

(54) ELECTROLUMINESCENT DISPLAY PANEL, METHOD FOR MANUFACTURING THE SAME, AND MASK

(71) Applicant: BOE TECHNOLOGY GROUP CO., LTD., Beijing (CN)

(72) Inventors: Minghua Xuan, Beijing (CN); Lei Wang, Beijing (CN); Shengji Yang, Beijing (CN); Pengcheng Lu, Beijing (CN); Li Xiao, Beijing (CN); Dongni Liu, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 266 days.

(21) Appl. No.: 16/210,424

(22) Filed: Dec. 5, 2018

(65) Prior Publication Data
US 2019/0229155 A1 Jul. 25, 2019

(30) Foreign Application Priority Data

Jan. 23, 2018 (CN) .......................... 201810065082.6

(51) Int. Cl.
*H01L 27/32* (2006.01)
*G06F 3/044* (2006.01)
(Continued)

(52) U.S. Cl.
CPC ............ *H01L 27/323* (2013.01); *G06F 3/044* (2013.01); *G06F 3/047* (2013.01); *G06F 3/0412* (2013.01);
(Continued)

(58) Field of Classification Search
CPC ......... G06F 2203/04103; G06F 3/0412; G06F 3/04164; G06F 3/044; G06F 3/0443;
(Continued)

(56) References Cited

U.S. PATENT DOCUMENTS

| 2013/0271388 A1* | 10/2013 | Chu | ...................... G06F 3/0412 345/173 |
|---|---|---|---|
| 2016/0132159 A1* | 5/2016 | Aoki | ...................... G06F 3/044 345/174 |

(Continued)

FOREIGN PATENT DOCUMENTS

| CN | 104716144 A | 6/2015 |
| CN | 107168574 A | 9/2017 |

OTHER PUBLICATIONS

The First Office Action dated Apr. 2, 2020 corresponding to Chinese application No. 201810065082.6.

*Primary Examiner* — Afroza Chowdhury
(74) *Attorney, Agent, or Firm* — Nath, Goldberg & Meyer; Joshua B. Goldberg

(57) ABSTRACT

An electroluminescent display panel, a method for manufacturing the same, and a mask are provided. The method for manufacturing an electroluminescent display panel includes: forming, on at least one side of a predetermined light-emitting layer of the electroluminescent display panel, an electrode layer having a pattern corresponding to patterns of masks under shielding of the masks through an evaporation process, wherein the predetermined light-emitting layer is a film layer for forming a light-emitting layer of the electroluminescent display panel.

11 Claims, 4 Drawing Sheets

(51) Int. Cl.
*G06F 3/041* (2006.01)
*G06F 3/047* (2006.01)
*H01L 51/52* (2006.01)
*H01L 51/56* (2006.01)
*H01L 51/50* (2006.01)

(52) U.S. Cl.
CPC ...... *H01L 51/5012* (2013.01); *H01L 51/5206* (2013.01); *H01L 51/5221* (2013.01); *H01L 51/5225* (2013.01); *H01L 51/56* (2013.01)

(58) Field of Classification Search
CPC ... G06F 3/047; H01L 27/323; H01L 51/5012; H01L 51/5206; H01L 51/5221; H01L 51/5225; H01L 51/56
See application file for complete search history.

(56) References Cited

U.S. PATENT DOCUMENTS

| | | | |
|---|---|---|---|
| 2016/0178948 A1* | 6/2016 | Li | H01L 51/5203 349/12 |
| 2019/0034577 A1* | 1/2019 | Wang | G03F 1/36 |

\* cited by examiner

Form, on at least one side of a predetermined light-emitting layer of an electroluminescent display panel, an electrode layer having a pattern corresponding to patterns of masks under shielding of the masks through an evaporation process, wherein the predetermined light-emitting layer is a film layer for forming a light-emitting layer of the electroluminescent display panel  S100

FIG. 1

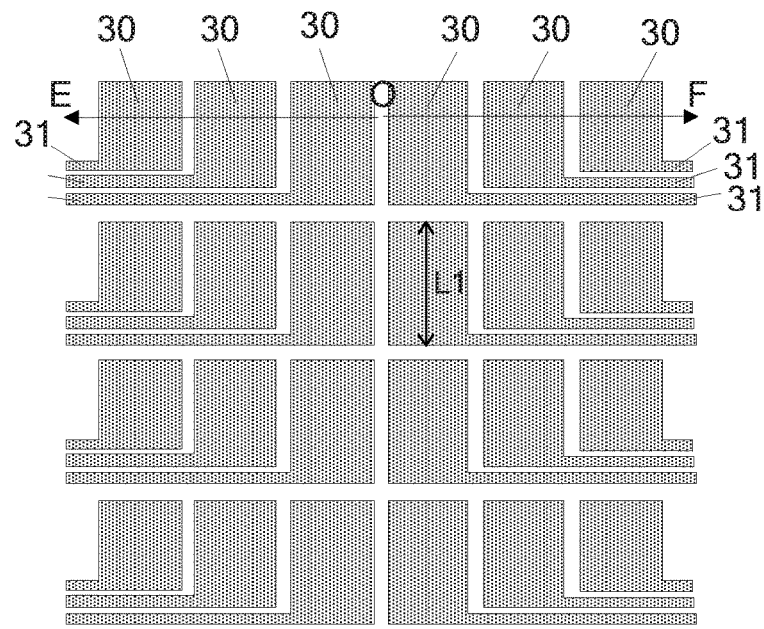

FIG. 2

ELECTROLUMINESCENT DISPLAY PANEL, METHOD FOR MANUFACTURING THE SAME, AND MASK

CROSS-REFERENCE TO RELATED APPLICATIONS

The present application claims the priority of Chinese Patent Application No. 201810065082.6, filed on Jan. 23, 2018 in the Chinese Patent Office, the contents of which are incorporated herein by reference in its entirety.

TECHNICAL FIELD

The present disclosure relates to the field of display technology, and in particular, to an electroluminescent display panel, a method of manufacturing the same, and a mask.

BACKGROUND

Touch electrodes of an electroluminescent display panel generally include a plurality of block-shaped touch electrodes and touch lead wires connected in one-to-one correspondence with the touch electrodes, and the touch electrodes are spaced apart from each other.

SUMMARY

According to an aspect of the disclosure, a method for manufacturing an electroluminescent display panel is provided, the method may include:

Forming masks according to at least two sub-patterns divided from a first pattern of an electrode layer to be formed of the electroluminescent display panel, respectively, each of the masks having a pattern corresponding to a responding one of the at least two sub-patterns; and Forming, on at least one side of a predetermined light-emitting layer of the electroluminescent display panel, the electrode layer having the first pattern corresponding to the patterns of the masks under shielding of the masks through an evaporation process, the predetermined light-emitting layer being a film layer for forming a light-emitting layer of the electroluminescent display panel.

In an embodiment, the electrode layer is a cathode layer; the cathode layer also serves as a touch electrode layer; and the touch electrode layer may includes a plurality of sub-touch electrodes which are mutually spaced apart from each other and touch lead wires connected in one-to-one correspondence with the sub-touch electrodes.

In an embodiment, the masks may include a first sub-mask and a second sub-mask; the first sub-mask may include a pattern corresponding to the sub-touch electrodes; and the second sub-mask may include a pattern corresponding to the touch lead wires.

The step of forming, on at least one side of a predetermined light-emitting layer of the electroluminescent display panel, the electrode layer having the first pattern corresponding to the patterns of the masks under shielding of the masks through an evaporation process may include: forming a pattern matched with the sub-touch electrodes on the predetermined light-emitting layer under shielding of the first sub-mask through the evaporation process; and forming a pattern matched with the touch lead wires on the predetermined light-emitting layer on which the sub-touch electrodes are formed under shielding of the second sub-mask through the evaporation process, each of the touch lead wires being connected to a responding one of the sub-touch electrodes.

In an embodiment, the masks may include a first sub-mask and a second sub-mask; the first sub-mask may include a pattern corresponding to the sub-touch electrodes; and the second sub-mask may include a pattern corresponding to the touch lead wires.

The step of forming, on at least one side of a predetermined light-emitting layer of the electroluminescent display panel, the electrode layer having the first pattern corresponding to the patterns of the masks under shielding of the masks through an evaporation process may include: forming a pattern matched with the touch lead wires on the predetermined light-emitting layer under shielding of the second sub-mask through the evaporation process; and forming a pattern matched with the sub-touch electrodes on the predetermined light-emitting layer on which the touch lead wires are formed under shielding of the first sub-mask through the evaporation process, each of the touch lead wires being connected to a responding one of the sub-touch electrodes.

In an embodiment, the first sub-mask may include a plurality of block-shaped first openings arranged in an array. For the first openings in each row, the first openings have lengths in a column direction perpendicular to a row direction that are sequentially decreased from a central region to each of both sides of the row.

The second sub-mask may include groups of second openings arranged in a plurality of rows and two columns, each group of second openings may include a plurality of second openings each of which is in a strip shape.

Second openings in each group of second openings have sequentially increased lengths in the column direction.

The step of forming a pattern matched with the sub-touch electrodes on the predetermined light-emitting layer under shielding of the first sub-mask through the evaporation process and the step of forming a pattern matched with touch lead wires on the predetermined light-emitting layer under shielding of the second sub-mask through the evaporation process may include: forming the sub-touch electrodes arranged in an array on the predetermined light-emitting layer under shielding of the first sub-mask through the evaporation process, the sub-touch electrodes in each row have lengths in the column direction that are sequentially decreased from a central region to each of both sides of the row; and forming a touch lead wire connected to each of the sub-touch electrodes at a lower end of the sub-touch electrode under shielding of the second sub-mask, the touch lead wires corresponding to a row of sub-touch electrodes being located in a gap between the row of sub-touch electrodes and a next row of sub-touch electrodes.

According to an aspect of the disclosure, an electroluminescent display panel manufactured by the method described above is provided.

In an embodiment, the electroluminescent display panel may include the electrode layer as a cathode layer. The cathode layer also serves as a touch electrode layer. The touch electrode layer may include a plurality of sub-touch electrodes which are mutually spaced apart from each other and touch lead wires connected in one-to-one correspondence with the sub-touch electrodes.

In an embodiment, the touch electrode layer may include a plurality of sub-touch electrodes arranged in an array and touch lead wires arranged in a same layer as the sub-touch electrodes.

For each row of sub-touch electrodes, the sub-touch electrodes have lengths in a column direction perpendicular to a row direction that are sequentially decreased from a central region to each of both sides of the row.

A touch lead wire connected to each of the sub-touch electrodes is formed at a lower end of the sub-touch electrode.

The touch lead wires corresponding to a row of sub-touch electrodes are located in a gap between the row of sub-touch electrodes and a next row of sub-touch electrodes.

In an embodiment, the sub-touch electrodes are self-capacitive electrodes.

According to an aspect of the disclosure, a mask is provided, the mask may include a pattern corresponding to the first pattern of the electrode layer of the electroluminescent display panel.

In an embodiment, the mask may include a first sub-mask and a second sub-mask. The electrode layer of the electroluminescent display panel is a cathode layer. The cathode layer also serves as a touch electrode layer. The touch electrode layer may include a plurality of sub-touch electrodes which are mutually spaced apart from each other and touch lead wires connected in one-to-one correspondence with the sub-touch electrodes.

The first sub-mask may include a plurality of block-shaped first openings arranged in an array.

For the first openings in each row, the first openings have lengths in a column direction perpendicular to a row direction that are sequentially decreased from a central region to each of both sides of the row.

The second sub-mask may include groups of second openings arranged in a plurality of rows and two columns, and each group of second openings may include a plurality of second openings each of which is in a strip shape.

The second openings in each group have sequentially increased lengths in the column direction.

When the second sub-mask is aligned with the first sub-mask, an orthographic projection of each of the groups of second openings of the second sub-mask, on the first sub-mask, is located in a gap between two adjacent rows of first openings of the first sub-mask.

The orthographic projection of each of the groups of second openings, on the first sub-mask, is in contact with corresponding ones of the first openings of the first sub-mask.

A combination of the first openings and the second openings constitutes a pattern corresponding to the sub-touch electrodes and a pattern corresponding to the touch lead wires, each of the touch lead wires is connected to a responding one of the sub-touch electrodes.

In an embodiment, at least a portion of the first openings in a central region of the first sub-mask are first standard openings, the first standard openings may include the at least a portion of the first openings which are adjacent and symmetric to each other in a central region of the first sub-mask, and remaining first openings other than the first standard openings are first compensatory openings.

Each of the first compensatory openings is provided with a first compensatory region at an end of the first compensatory opening proximal to a next row of first openings, a pattern formed by each of the first compensatory openings and a corresponding one of the first compensatory regions is the same as a pattern formed by each of the first standard openings, and each of the first compensatory regions is a region having a reduced thickness.

In an embodiment, for each group of second openings, a second opening that is closest to a group of second openings in a next column is a second standard opening, and remaining second openings other than the second standard opening are second compensatory openings. Each of the second compensatory openings is provided with a second compensatory region at an end of the second compensatory opening proximal to a next column of second openings. A pattern formed by each of the second compensatory openings and a corresponding second compensatory region is the same as a pattern formed by each of the second standard openings. Each of the second compensatory regions is a region having a reduced thickness.

In an embodiment, each of the first compensatory regions has a thickness that is half a thickness of the first sub-mask. Each of the second compensatory regions has a thickness that is half a thickness of the second sub-mask.

BRIEF DESCRIPTION OF THE DRAWINGS

FIG. 1 is a flow diagram for manufacturing an electroluminescent display panel according to an embodiment of the present disclosure;

FIG. 2 is a schematic diagram of a structure of a touch electrode according to an embodiment of the present disclosure;

DETAILED DESCRIPTION

Figure 3:
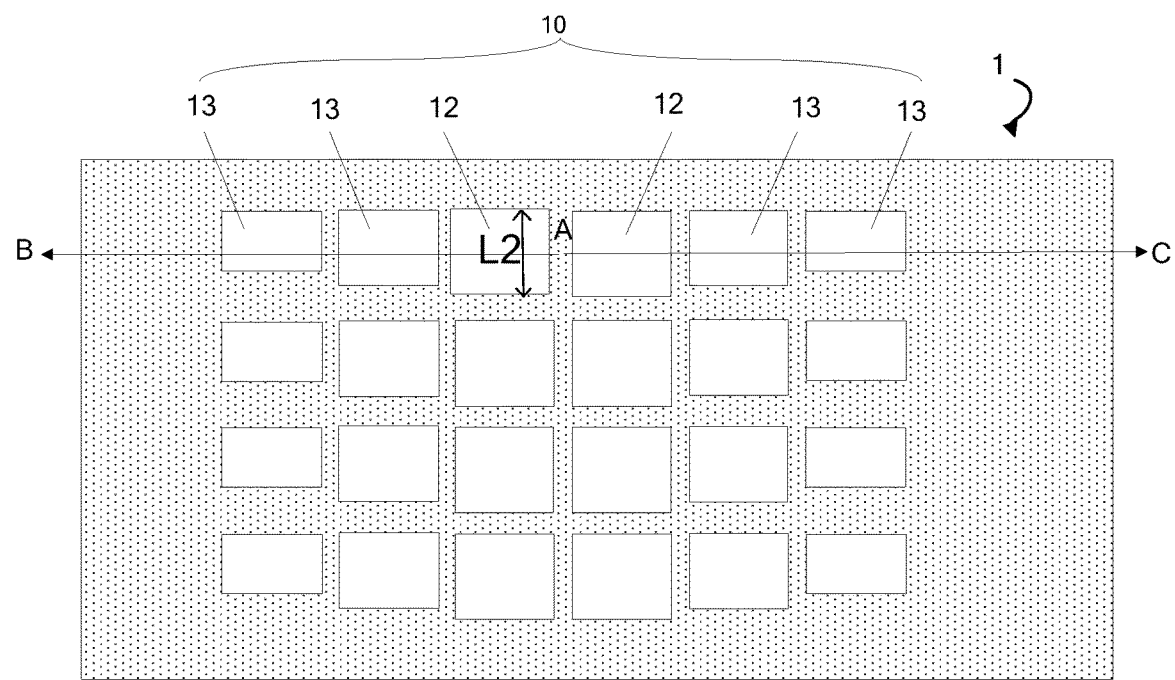
FIG. 3 is a schematic diagram of a structure of a first sub-mask according to an embodiment of the present disclosure.

In order to make the objects, technical solutions and advantages of the embodiments of the present disclosure more clear, the technical solutions of the embodiments of the present disclosure will be clearly and completely described below in conjunction with the drawings of the embodiments of the present disclosure. It is apparent that the described embodiments are only some embodiments of the present disclosure, and not all embodiments of the present disclosure. Other embodiments obtained by a person of ordinary skill in the art based on the described embodiments of the present disclosure without departing from the scope of the present invention are within the scope of the disclosure.

Technical or scientific terms used in the present disclosure are intended to be understood in the general sense by one of ordinary skill in the art, unless otherwise defined. The terms such as "first", "second" used in the present disclosure do not denote any order, quantity, or importance, but are used to distinguish different components. The words "including", "comprising", and the like, are intended to mean that the elements or items before the words contain elements or items listed behind the words, and do not exclude other elements or items. "Connected" or "connecting" and the like are not limited to physical or mechanical connections, but may include directly or indirectly electrical connections. "Upper", "lower", "left", "right", etc. are only used to indicate the relative positional relationship, and when the absolute position of the object being described is changed, the relative positional relationship may also change accordingly.

In order to keep description of the embodiments of the present disclosure clear and concise, detailed descriptions of known functions and known components are omitted in the present disclosure.

FIG. 1 is a flow diagram for manufacturing an electroluminescent display panel according to an embodiment of the present disclosure. Referring to FIG. 1, a method for manufacturing an electroluminescent display panel is provided in an embodiment of the present disclosure, the method may include the following step S100.

In step S100, an electrode layer having a pattern corresponding to a pattern of a mask is formed under shielding of the mask through an evaporation process, on at least one side of a predetermined light-emitting layer of an electroluminescent display panel. The predetermined light-emitting layer is a film layer for forming a light-emitting layer of the electroluminescent display panel.

In the embodiment of the disclosure, the electrode layer having the pattern corresponding to the pattern of the mask is formed on at least one side of a predetermined light-emitting layer of an electroluminescent display panel, under shielding of the mask through an evaporation process. It is unnecessary to form a photoresist firstly, to etch the photoresist into a photoresist shielding wall having an inverted trapezoidal shape, and to perform an evaporation process so as to form mutually spaced apart electrode patterns. Because the photoresist shielding wall having an inverted trapezoidal shape is formed at a certain slop angle, a relatively complicated manufacturing process is required and the stability of a current structure of the inverted trapezoidal photoresist cannot be ensured. Therefore, according to the method for manufacturing a touch electrode of an electroluminescent display panel provided by the present disclosure, the process of manufacturing the electrode layer can be simplified, and the performance of the formed electrode layer can be stabilized.

The manufacturing method according to the embodiment of the present disclosure may form the electrode layer using several masks (e.g., two masks), so as to omit a photoresist etching process, and may be compatible with the existing evaporation and packaging processes of mass-manufactured display panels, which facilitates the mass production of display panels.

In an embodiment, a light-emitting layer may be formed first, and then an electrode layer is formed on the light-emitting layer. Alternatively, an electrode layer may be formed first, and then a light-emitting layer may be formed on the electrode layer.

Specifically, an electroluminescent display panel may be an Organic Light-Emitting Diode (OLED) panel or a Quantum Dot Light-emitting Diode (QLED) panel.

Specifically, the electrode layer may be an anode layer or a cathode layer of the electroluminescent display panel.

In an embodiment, prior to the formation the electrode layer, the method of manufacturing the electroluminescent display panel further includes the step of forming a mask having a patter according to a pattern of the electrode layer to be formed.

In an embodiment, the step of forming a mask having a pattern according to a pattern of the electrode layer to be formed includes: forming masks according to at least two sub-patterns divided from a pattern of an electrode layer to be formed of the electroluminescent display panel, respectively, each of the masks having a pattern corresponding to a responding one of the at least two sub-patterns For example, the electrode layer is a cathode layer, and the cathode layer also serves as a touch electrode layer. In an embodiment, the touch electrode layer may include a plurality of sub-touch electrodes which are mutually spaced apart from each other and touch lead wires connected in one-to-one correspondence with the sub-touch electrodes. The masks may include a first sub-mask and a second sub-mask. The first sub-mask may include a pattern corresponding to the sub-touch electrodes, and the second sub-mask may include a pattern corresponding to the touch lead wires. In an embodiment, the pattern corresponding to the sub-touch electrodes is formed first, and then the pattern corresponding to the touch lead wires is formed. Alternatively, in another embodiment, the pattern corresponding to the touch lead wires is formed first, and then the pattern corresponding to the sub-touch electrodes is formed.

In an embodiment, the step of forming, on at least one side of a predetermined light-emitting layer of the electroluminescent display panel, the electrode layer having the pattern corresponding to the patterns of the masks, under shielding of the masks through an evaporation process may include the following steps:

Forming the pattern corresponding to or matched with the sub-touch electrodes on the predetermined light-emitting layer under shielding of the first sub-mask through the evaporation process; and Forming the pattern corresponding to the touch lead wires on the predetermined light-emitting layer of the electroluminescent display panel on which the sub-touch electrodes are formed, under shielding of the second sub-mask through the evaporation process. Each of the touch lead wires is connected to a responding one of the sub-touch electrodes.

Alternatively, the step of forming, on at least one side of a predetermined light-emitting layer of the electroluminescent display panel, the electrode layer having the pattern corresponding to the patterns of the masks, under shielding of the first sub-mask and the second sub-mask through an evaporation process may include the following steps:

Forming the pattern corresponding to touch lead wires on the predetermined light-emitting layer under shielding of the second sub-mask through the evaporation process; and Forming the pattern corresponding to the sub-touch electrodes on the predetermined light-emitting layer of the electroluminescent display panel on which the sub-touch electrodes are formed, under shielding of the first sub-mask through the evaporation process. Each of the touch lead wires is connected to a responding one of the sub-touch electrodes.

Since the mask is generally formed on a mask frame by stretching and soldering a plurality of mask strips including vapor deposition openings. In case where the pattern of the electrode layer is relatively complicated, if the pattern of the electrode layer is directly formed through a pattern on one mask, the vapor deposition openings on the mask strips may be deformed when the mask strips are stretched. Thus, the predetermined pattern of the electrode layer cannot be formed. Therefore, at least two masks may be manufactured according to at least two sub-patterns divided by the pattern of the electrode layer to be formed, wherein one mask corresponds to one sub-pattern (e.g., a sub-pattern of the sub-touch electrodes) of the electrode layer, and another mask corresponds to another sub-pattern (e.g., a sub-pattern of the touch lead wires) of the electrode layer, thereby forming a complete pattern of the electrode layer. It should be understood that the at least two divided sub-patterns are patterns that are not easily deformed in the stretching direction, which will be described in detail below.

In an embodiment, the electrode layer is a cathode layer, and the cathode layer also serves as a touch electrode layer. For example, the touch electrode layer to be formed includes a plurality of sub-touch electrodes which are mutually spaced apart from each other and touch lead wires connected in one-to-one correspondence with the sub-touch electrodes.

FIG. 2 is a schematic diagram of a structure of a touch electrode according to an embodiment of the present disclosure. As shown in FIG. 2, the touch electrode layer includes a plurality of sub-touch electrodes 30 arranged in an array and a plurality of touch lead wires 31 disposed in the same layer as the sub-touch electrodes 30. That is, the electrode layer is divided into a sub-pattern of the sub-touch electrodes 30 and a sub-pattern of the touch lead wires 31. For each row of sub-touch electrodes 30, along OE and OF directions extending from the middle or a central region of the row to each of both sides of the row, the sub-touch electrodes 30 have lengths L1 in a direction perpendicular to the row direction that are sequentially decreased. In other words, for each row of the sub-touch electrodes 30, the lengths L1 of the sub-touch electrodes are decreased from the central region to the both sides in the row direction. In other words, in the EF direction (i.e., the row direction), for each row of the sub-touch electrodes 30, the lengths L1 of the sub-touch electrodes 30 in the direction (the column direction) perpendicular to the row direction are decrease sequentially from the central region (i.e., the position O) toward the both sides (i.e., the OE direction and the OF direction). For example, the sub-touch electrodes 30 located at the central region have the longest length, and the sub-touch electrodes 30 at the leftmost and rightmost sides have the smallest length. Each of the sub-touch electrodes 30 is provided at a lower end thereof with a touch lead wire 31 that is in contact with the sub-touch electrode 30. The touch lead wires 31 corresponding to a row of the sub-touch electrode 30 are located in a gap between the row of sub-touch electrodes 30 and a next row of sub-touch electrodes 30.

Figure 4:
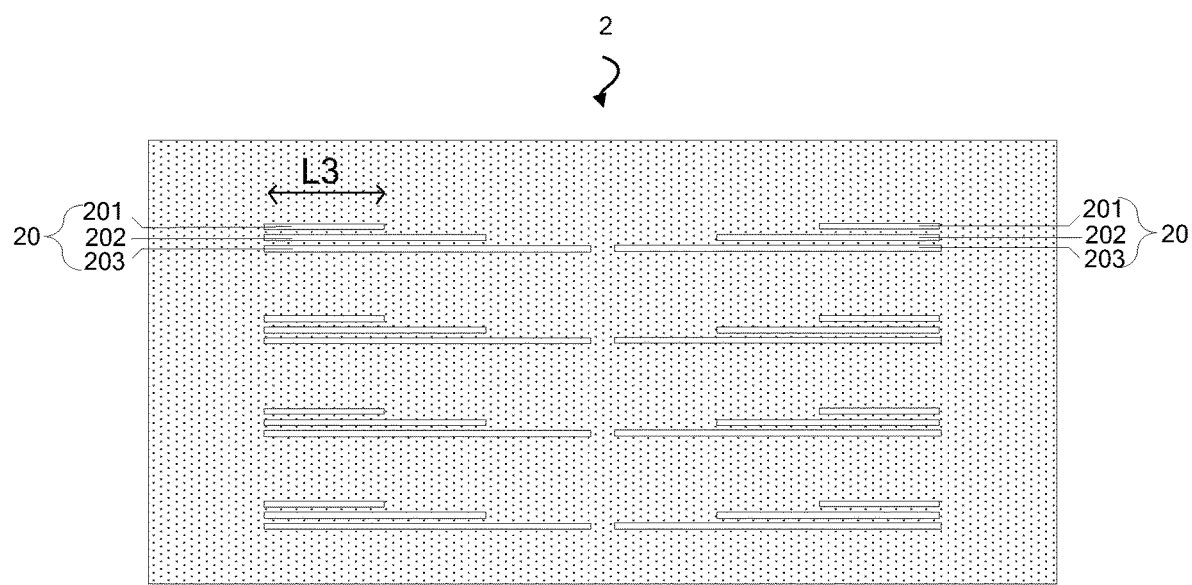
FIG. 4 is a schematic diagram of a structure of a second sub-mask according to an embodiment of the present disclosure.

FIG. 3 is a schematic diagram of a structure of a first sub-mask according to an embodiment of the present disclosure. As shown in FIG. 3, the mask includes a first sub-mask 1 and a second sub-mask 2 which is shown in FIG. 4. The first sub-mask 1 includes a pattern matched with the sub-touch electrodes 30, and the second sub-mask 2 includes a pattern matched with the touch lead wires 31. Referring to FIG. 3, the first sub-mask 1 is provided with block-shaped first openings 10 (for example, rectangular first openings 10) distributed in an array. For the first openings 10 in each row, along AB or AC direction extending from the middle (or the central region) to each of the both sides of the row, the first openings 10 have lengths in the direction (i.e., column direction) perpendicular to the row direction that are sequentially decreased. As shown in the FIG. 3, along the AB direction extending from the middle to the left side of the row and AC direction extending from the middle to the right side of the row in FIG. 3, the first openings have the lengths in the direction perpendicular to the row direction that are decreased sequentially. In other words, in the BC direction (i.e., the row direction), the lengths L2 of the first openings 10 in the direction perpendicular to the row direction is decreased sequentially from the central region (i.e., position A)) toward the both sides (i.e., side B and side C). For example, the first openings 12 in the middle or at the central region have the largest length, and first openings 13 on the leftmost and rightmost sides have the smallest length.

FIG. 4 is a schematic diagram of a structure of a second sub-mask according to an embodiment of the present disclosure. Referring to FIG. 4, the second sub-mask 2 includes groups of second openings 20 arranged in two columns and a plurality of rows. For example, FIG. 4 shows that the groups of second openings 20 are arranged in two columns and four rows, but the present disclosure is not limited thereto. The number of rows of the second opening groups 20 can be set according to the number of electrodes. In addition, each group of the second openings 20 includes a plurality of second openings 201, 202, 203 that are parallel to each other, and each of the second openings 201, 202, 203 has a strip shape. For example, FIG. 4 shows that each group of the second openings 20 includes three second openings 201, 202, 203, but the disclosure is not limited thereto. The number of the second openings of each group of the second openings 20 can be directly related to the number of electrodes. For each group of the second openings 20, along the column direction perpendicular to the row direction and directed to a next row of second openings 20, the second openings 201, 202, 203 have lengths in the row direction that are increased sequentially from each of the both sides towards the middle or the central region of the row. In other words, along the direction parallel to the length of the second openings 201, 202, 203, the lengths L3 of the second openings 201, 202, 203 are increased from top to bottom. For example, the second opening 201 on the top has the shortest length, the second opening 202 in the middle has a length longer than that of the second opening 201, and the second opening 203 on the bottom has the longest length that is longer than the lengths of the second openings 201 and 202.

The steps of forming, on at least one side of the predetermined light-emitting layer, the electrode layer having a pattern corresponding to the patterns of the first sub-mask and the second sub-mask, under shielding of the first sub-mask and the second sub-mask through an evaporation process, based on a pattern of a touch electrode layer to be formed, includes steps S1 and S2 as follows.

In step S1, the sub-touch electrodes arranged in an array are formed on the predetermined light-emitting layer under shielding of the first sub-mask through the evaporation process. For each row of sub-touch electrodes, the sub-touch electrodes in each row have lengths in the column direction that are sequentially decreased along the directions (i.e., AB and AC directions) from the central region to the both sides of the row. In other words, for each row of sub-touch electrodes, as shown in FIG. 2, the sub-touch electrodes in each row have lengths L1 that are decreased gradually from the middle to the two sides of the row direction.

In step S2, a touch lead wire connected to each of the sub-touch electrodes is formed at a lower end of the sub-touch electrode, under shielding of the second sub-mask. The touch lead wires corresponding to a row of sub-touch electrodes are located in a gap between the row of sub-touch electrodes and a next row of sub-touch electrodes.

It should be noted that, before the forming of the touch electrode layer, the manufacturing method may further include: forming a light-emitting layer of the display panel by an evaporation process. Further, after the forming of the touch electrode layer, the manufacturing method may further include: forming a thin-film packaging layer by the evaporation process. In the embodiment of the present disclosure, the touch electrode is formed by using the mask through the evaporation process, so that the manufacturing process of the touch electrode is compatible with the manufacturing processes of the light-emitting layer and the packaging layer of the display panel, which is advantageous for mass production of the display panel.

An embodiment of the present disclosure provides an electroluminescent display panel, which is fabricated by the manufacturing method according to the above embodiments. In the electroluminescent display panel, the electrode layer may be an anode or a cathode. Furthermore, the electroluminescent display panel may include a light-emitting layer. The electrode layer may be disposed under the light-emitting layer. Alternatively, the electrode layer may be disposed on/above the light-emitting layer. Alternatively, two electrode layers may be disposed under the light-emitting layer and on/above the light-emitting layer, respectively. One electrode layer may be an anode layer under the light-emitting layer, and the other electrode layer may be a cathode layer above the light-emitting layer.

Figure 7:
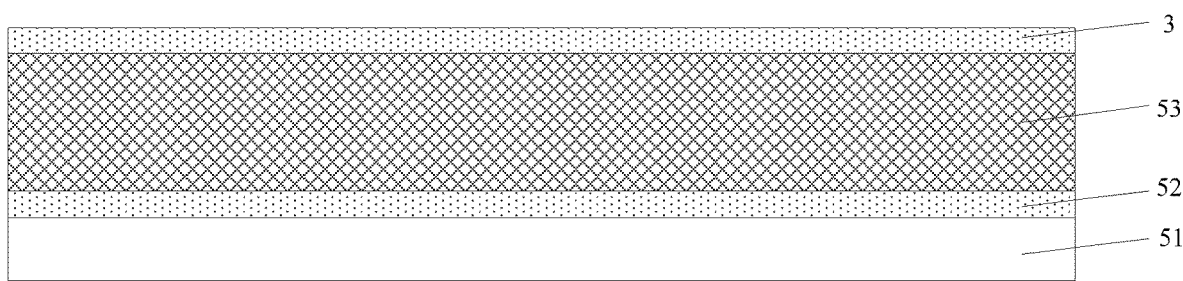
FIG. 7 is a schematic diagram of a structure of an electroluminescent display panel according to an embodiment of the present disclosure.

FIG. 7 is a schematic diagram of a structure of an electroluminescent display panel according to an embodiment of the present disclosure. An example that the electrode layer as a cathode layer is located on/above the light-emitting layer is described. Referring to FIG. 7, the electroluminescent display panel may include a substrate 51, an anode or anode layer 52 on the substrate 51, a light-emitting layer 53 on the anode layer 52, and a cathode layer (which also serves as the touch electrode layer 3) on the light-emitting layer 53. Specifically, the touch electrode layer 3 is disposed on the light-emitting layer 53. The touch electrode layer 3 includes a plurality of sub-touch electrodes spaced apart from each other and touch lead wires, each of the touch lead wires being connected in one-to-one correspondence with the sub-touch electrodes.

Specifically, as shown in FIG. 2, the touch electrode layer 3 includes a plurality of sub-touch electrodes 30 arranged in an array and a plurality of touch lead wires 31 disposed in the same layer as the sub-touch electrodes 30. For each row of sub-touch electrodes 30, in a OE and OF directions extending from the middle or a central region to each of both sides of the row, the sub-touch electrodes 30 have lengths L1 in a direction perpendicular to the row direction that are sequentially decreased. In other words, for each row of the sub-touch electrodes 30, the lengths L1 of the sub-touch electrodes are decreased from the central region to each of the both sides in the row direction. In other words, in the EF direction (i.e., the row direction), for each row of the sub-touch electrodes 30, the lengths L1 of the sub-touch electrodes 30 in the direction (the column direction) perpendicular to the row direction are decreased sequentially from the central region (i.e., the position O) toward each of the both sides (i.e., the OE direction and the OF direction). For example, the sub-touch electrodes 30 located at the central region have the longest length, and the sub-touch electrodes 30 at the leftmost and rightmost sides have the smallest length. Each of the sub-touch electrodes 30 is provided at a lower end thereof with a touch lead wire 31 that is in contact with the sub-touch electrode 30. The touch lead wires 31 corresponding to a row of the sub-touch electrode 30 are located in a gap between the row of sub-touch electrodes 30 and a next row of sub-touch electrodes 30.

In an embodiment, each of the sub-touch electrodes 30 may be formed as a rectangle shape, but the disclosure is not limited thereto. It should be noted that each of the sub-touch electrodes and each of the touch lead wires may also have other shapes.

In an embodiment, the sub-touch electrodes are self-capacitive touch electrodes.

In an embodiment, the electroluminescent display panel may include an active matrix organic light-emitting display panel.

A mask is provided according to an embodiment of the disclosure, the mask may include a pattern corresponding to a pattern of the electrode layer of the electroluminescent display panel according to the above embodiments.

In an embodiment, the electrode layer of the electroluminescent display panel is a cathode layer, and the cathode layer also serves as a touch electrode layer. The touch electrode layer may include a plurality of sub-touch electrodes which are mutually spaced apart from each other and touch lead wires connected in one-to-one correspondence with the sub-touch electrodes.

Specifically, as shown in FIG. 2, the touch electrode layer includes a plurality of sub-touch electrodes 30 arranged in an array and a plurality of touch lead wires 31 disposed in the same layer as the sub-touch electrodes 30. That is, the pattern of the electrode layer is divided into a sub-pattern of the sub-touch electrodes 30 and a sub-pattern of the touch lead wires 31. For each row of sub-touch electrodes 30, in the OE and OF directions extending from the middle or a central region to each of both sides of the row, the sub-touch electrodes 30 have lengths L1 in a direction perpendicular to the row direction that are sequentially decreased. In other words, for each row of the sub-touch electrodes 30, the lengths L1 of the sub-touch electrodes are decreased from the central region to the both sides in the row direction. In other words, in the EF direction (i.e., the row direction), for each row of the sub-touch electrodes 30, the lengths L1 of the sub-touch electrodes 30 in the direction (the column direction) perpendicular to the row direction are decreased sequentially from the central region (i.e., the position O) toward each of the both sides (i.e., the OE direction and the OF direction). For example, the sub-touch electrodes 30 located at the central region have the longest length, and the sub-touch electrodes 30 at the leftmost and rightmost sides have the smallest length.

Each of the sub-touch electrodes 30 is provided at a lower end thereof with a touch lead wire 31 that is in contact with the sub-touch electrode 30. The touch lead wires 31 corresponding to a row of the sub-touch electrode 30 are located in a gap between the row of sub-touch electrodes 30 and a next row of sub-touch electrodes 30.

In an embodiment, the masks for manufacturing the electrode layer may include a first sub-mask and a second sub-mask. The first sub-mask includes a pattern corresponding to the sub-touch electrodes, and the second sub-mask includes a pattern corresponding to the touch lead wires.

Referring to FIG. 3, the first sub-mask 1 is provided with block-shaped first openings 10 (for example, a plurality of rectangular first openings 10) distributed in an array. For the first openings 10 in each row, in the AB and AC directions in FIG. 3 extending from the middle to each of the both sides of the row, the first openings 10 have lengths in the direction (i.e., column direction) perpendicular to the row direction that are sequentially decreased. As shown in the FIG. 3, along the AB direction extending from the middle to the left side of the row and AC direction extending from the middle to the right side of the row in FIG. 3, first openings have the lengths in the direction perpendicular to the row direction that are decreased sequentially. In other words, in the BC direction (i.e., the row direction), the lengths L2 of the first openings 10 in the direction perpendicular to the row direction is decreased sequentially from the central region (i.e., position A) toward each of the both sides (i.e., side B and side C). For example, the first openings 12 in the middle or at the central region have the largest length, and first openings 13 on the leftmost and rightmost sides have the smallest length.

Referring to FIG. 4, the second sub-mask 2 includes groups of second openings 20 arranged in two columns and a plurality of rows. For example, FIG. 4 shows that the groups of second openings 20 are arranged in two columns and four rows, but the present disclosure is not limited thereto. The number of rows of the second opening groups 20 can be set according to the number of electrodes. In addition, each group of the second openings 20 includes second openings 201, 202, 203, and each of the second openings 201, 202, 203 has a strip shape. For example, FIG. 4 shows that each group of the second openings 20 includes three second openings 201, 202, 203, but the disclosure is not limited thereto. The number of the second openings of each group of the second openings 20 can be directly related to the number of electrodes. For each group of the second openings 20, along the column direction perpendicular to the row direction and directed to a next row of second openings 20, the second openings 201, 202, 203 have lengths in the row direction that are increased sequentially from the both sides towards the middle or the central region of the row. In other words, along the direction parallel to the length direction of the second openings 201, 202, 203, the lengths L3 of the second openings 201, 202, 203 are increased from top to bottom. For example, the second opening 201 on the top has the shortest length, the second opening 202 in the middle has a length longer than that of the second opening 201, and the second opening 203 on the bottom has the longest length that is longer than the lengths of the second openings 201 and 202. In an embodiment, when the electroluminescent display panel is fabricated, the second sub-mask 2 is vertically aligned with the first sub-mask 1, such that an orthographic projection of each group of second openings 20 of the second sub-mask 2, on the first sub-mask 1, is located in a gap between two adjacent rows of first openings 10 of the first sub-mask 1, and the orthographic projection, on the first sub-mask 1, of each group of second openings 20 of the second sub-mask 2 is sequentially in contact with corresponding ones (for example, three first openings in the AB direction or in the AC direction in FIG. 3) of the first openings 10 of the first sub-mask 1. The combination of the first openings 10 and the second openings 20 constitutes a pattern for forming the sub-touch electrodes 30 and a pattern of touch lead wires 31 connected to the corresponding sub-touch electrodes 30.

The mask according to the embodiment of the present disclosure includes a first sub-mask and a second sub-mask. The first sub-mask includes a plurality of block-shaped first openings distributed in an array, and the second sub-mask includes a plurality of strip-shaped second openings. With the cooperation of the first sub-mask and the second sub-mask, the pattern of the sub-touch electrodes is formed through the first openings of the first sub-mask, and the pattern of the touch lead wires connected in one-to-one correspondence with the sub-touch electrodes is formed through the second openings of the second sub-mask. The touch electrode of the display panel may be formed by using the first sub-mask and the second sub-mask through two evaporation processes, so that it is unnecessary to form a photoresist firstly, to etch the photoresist into a photoresist shielding wall having an inverted trapezoidal shape, and then to perform an evaporation process so as to form mutually spaced apart touch electrodes. Because the photoresist shielding wall having the inverted trapezoidal shape is formed with a certain slop angle, a relatively complicated manufacturing process is required and the stability of a current structure of the inverted trapezoidal photoresist cannot be ensured. Therefore, according to the method for manufacturing an electrode layer of the electroluminescent display panel by using the mask provided by the present disclosure, the process of forming the electrode layer can be simplified, and the performance of the formed electrode layer can be stabilized. The manufacturing method according to the embodiment of the present disclosure may form the electrode layer using the first sub-mask and the second sub-mask, so as to omit a photoresist etching process, and may be compatible with the existing evaporation and packaging processes of mass-manufactured display panels, which facilitates the mass production of display panels.

It should be noted that, since the mask is formed by stretching and welding a plurality of mask strips onto the mask frame in the related art, the problem of poor evaporation may occur during the manufacturing process due to a large change in the shape of the openings of the mask strips when the mask strips are stretched. However, in the present disclosure, with the first sub-mask provided with a plurality of block-shaped first openings arranged in an array and the second sub-mask provided with second openings in a strip shape, the pattern setting of the first sub-mask and the second sub-mask can avoid the problem of poor evaporation that occurs in case where only one mask is used in the related art.

Figure 5:
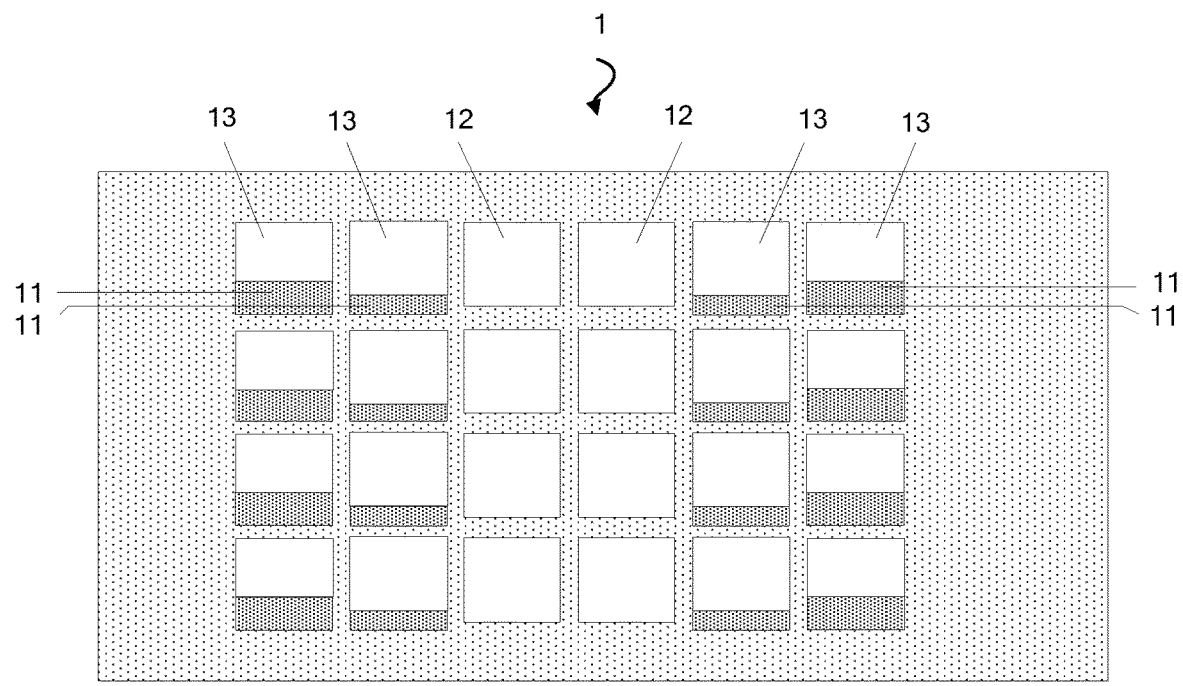
FIG. 5 is a schematic diagram of a structure of a first sub-mask provided with a first compensatory region according to an embodiment of the present disclosure.

FIG. 5 is a schematic diagram of structure of a first sub-mask provided with a first compensation region according to an embodiment of the present disclosure. Referring to FIG. 5, at least part of the first openings in the middle or the central region of the first sub-mask 1 are first standard openings 12. Each of the first standard openings 12 among all the first openings 10 has the largest area. The remaining openings other than the first standard openings 12 are first compensation openings 13. Each of the first compensation openings is provided with a first compensation region 11 at an end of the first compensation opening that is proximal to the first openings in the next row. A pattern formed by each of the first compensation openings and a corresponding one of first compensation regions 11 is the same as a pattern formed by the first standard opening 12, and the first compensation region 11 is a region having a reduced thickness. For example, the thickness of the first compensation region 11 is half that of the first sub-mask 1. In the embodiment of the present disclosure, since the first compensation region 11 is disposed at the end of each of the first compensation openings proximal to the next row of the first openings, the regions in the first sub-mask 1 can have substantially the same weight and stress, thereby avoiding the wrinkle of the produced mask due to different sizes of the openings in the mask when the mask is stretched during the manufacturing process, preventing an offset of the evaporated material due to the wrinkle in the evaporation process after the stretch process, and ensuring that the evaporated material is properly evaporated onto the substrate.

In an embodiment, at least part of the first openings that are adjacent and (axially) symmetrical to each other with regard to a vertical central axis of the first sub-mask 1 are defined as the first standard openings 11, such as the two openings in the middle of the first row as shown in FIG. 5. Here, the adjacent and symmetrical arrangement means that at least two first openings are adjacent, and are symmetrically distributed with regard to the central axis of the first sub-mask. Whether the first standard openings 11 have the same size or not is not limited herein.

Figure 6:
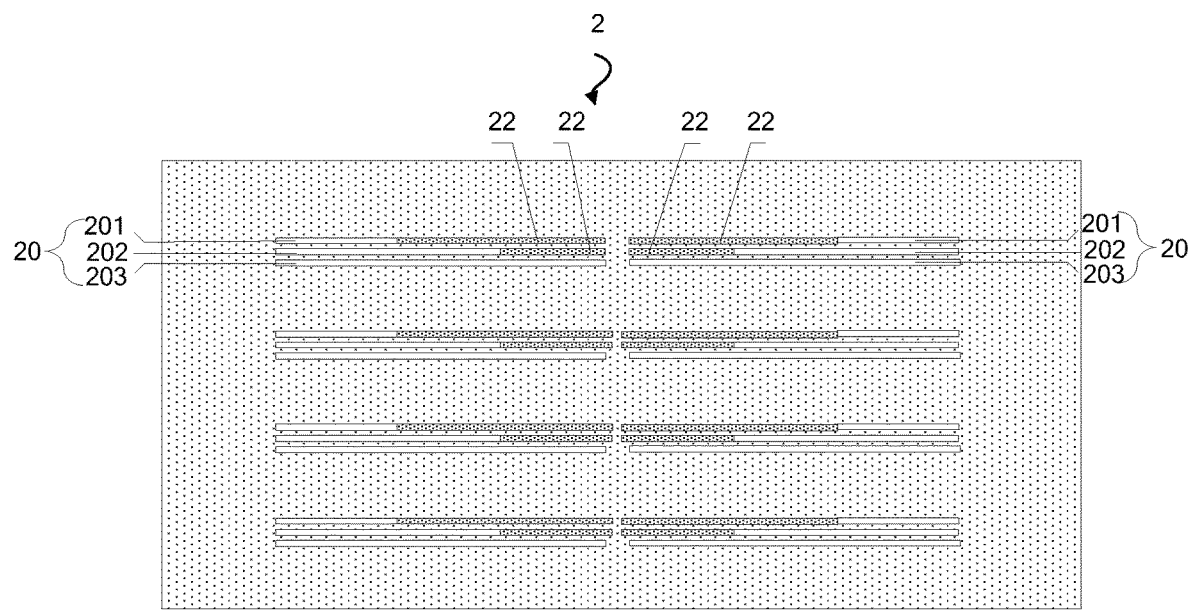
FIG. 6 is a schematic diagram of a structure of a second sub-mask provided with a second compensatory region according to an embodiment of the present disclosure.

FIG. 6 is a schematic diagram of structure of a second sub-mask provided with a second compensation region according to an embodiment of the present disclosure. Referring to FIG. 6, a second opening of each group of second openings 20 that is nearest to a next group of second openings 20 is defined as a second standard opening 203 (such as the lowest second opening 203 of the group of second openings in the first row in FIG. 6). The second standard opening 203 among all the second openings in a group has the largest area. The remaining openings other than the second standard openings 203 in a group are second compensation openings 201, 202 (such as the first one and the second one on the top of the group of second opening 20). Each of the second compensation openings 201 and 202 is provided with a second compensation region 22 at an end of the second compensation opening that is proximal to the second openings in the next column. A pattern formed by each of the second compensation openings 201 and 202 and a corresponding one of the second compensation regions 22 is the same as a pattern formed by the second standard opening 203, and each of the second compensation regions 22 is a region having a reduced thickness. For example, the thickness of each of the second compensation regions 22 is half that of the second sub-mask 2.

In the embodiment of the present disclosure, since the second compensation region 22 is disposed at the end of each of the second compensation openings proximal to the next column of the second openings, the regions in the second sub-mask 2 can have substantially the same weight and stress, thereby avoiding the wrinkle of the produced mask due to different sizes of the openings in the mask when the mask is stretched during the manufacturing process, preventing an offset of the evaporated material due to the wrinkle in the evaporation process after the stretch process, and ensuring that the evaporated material is properly evaporated onto the substrate.

In an embodiment, each of the first opening has a rectangle shape.

In the embodiment of the present disclosure, since the first opening has a rectangle shape, the influence of the stretching on the first sub-mask can be reduced when the first sub-mask is manufactured, thereby avoiding a malfunction of the formed touch electrode and realizing better touch control.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as falling within the scope of the present disclosure.

What is claimed is:

1. A method for manufacturing an electroluminescent display panel, comprising:

forming masks according to at least two sub-patterns divided from a first pattern of an electrode layer to be formed of the electroluminescent display panel, respectively, each of the masks having a pattern corresponding to a corresponding one of the at least two sub-patterns; and forming, on at least one side of a predetermined light-emitting layer of the electroluminescent display panel, the electrode layer having the first pattern corresponding to the patterns of the masks under shielding of the masks through an evaporation process, the predetermined light-emitting layer being a film layer for forming a light-emitting layer of the electroluminescent display panel, the electrode layer is a cathode layer;

the cathode layer also serves as a touch electrode layer; and the touch electrode layer comprises a plurality of sub-touch electrodes which are mutually spaced apart from each other and touch lead wires connected in one-to-one correspondence with the sub-touch electrodes, the masks comprise a first sub-mask and a second sub-mask;

the first sub-mask comprises a pattern corresponding to the sub-touch electrodes;

the second sub-mask comprises a pattern corresponding to the touch lead wires; and the step of forming, on at least one side of a predetermined light-emitting layer of the electroluminescent display panel, the electrode layer having the first pattern corresponding to the patterns of the masks under shielding of the masks through an evaporation process comprises:

forming a pattern matched with the sub-touch electrodes on the predetermined light-emitting layer under shielding of the first sub-mask through the evaporation process; and forming a pattern matched with the touch lead wires on the predetermined light-emitting layer on which the sub-touch electrodes are formed under shielding of the second sub-mask through the evaporation process, each of the touch lead wires being connected to a corresponding one of the sub-touch electrodes.

2. The method according to claim 1, wherein the first sub-mask comprises a plurality of block-shaped first openings arranged in an array;

for the first openings in each row, the first openings have lengths in a column direction perpendicular to a row direction that are sequentially decreased from a central region to each of both sides of the row;

the second sub-mask comprises groups of second openings arranged in a plurality of rows and two columns, each group of second openings comprises a plurality of second openings each of which is in a strip shape; and second openings in each group of second openings have sequentially increased lengths in the column direction; and the step of forming a pattern matched with the sub-touch electrodes on the predetermined light-emitting layer under shielding of the first sub-mask through the evaporation process and the step of forming a pattern matched with touch lead wires on the predetermined light-emitting layer under shielding of the second sub-mask through the evaporation process comprise:

forming the sub-touch electrodes arranged in an array on the predetermined light-emitting layer under shielding of the first sub-mask through the evaporation process, the sub-touch electrodes in each row have lengths in the column direction that are sequentially decreased from a central region to each of both sides of the row; and forming a touch lead wire connected to each of the sub-touch electrodes at a lower end of the sub-touch electrode under shielding of the second sub-mask, the touch lead wires corresponding to a row of sub-touch electrodes being located in a gap between the row of sub-touch electrodes and a next row of sub-touch electrodes.

3. An electroluminescent display panel, manufactured by the method according to claim 1.

4. The electroluminescent display panel according to claim 3, comprising the electrode layer as a cathode layer, wherein
- the cathode layer also serves as a touch electrode layer; and
- the touch electrode layer comprises a plurality of sub-touch electrodes which are mutually spaced apart from each other and touch lead wires connected in one-to-one correspondence with the sub-touch electrodes.

5. The electroluminescent display panel according to claim 3, wherein
- the touch electrode layer comprises a plurality of sub-touch electrodes arranged in an array and touch lead wires arranged in a same layer as the sub-touch electrodes;
- for each row of sub-touch electrodes, the sub-touch electrodes have lengths in a column direction perpendicular to a row direction that are sequentially decreased from a central region to each of both sides of the row;
- a touch lead wire connected to each of the sub-touch electrodes is formed at a lower end of the sub-touch electrode; and
- the touch lead wires corresponding to a row of sub-touch electrodes are located in a gap between the row of sub-touch electrodes and a next row of sub-touch electrodes.

6. The electroluminescent display panel according to claim 4, wherein
- the sub-touch electrodes are self-capacitive electrodes.

7. A mask, comprising a pattern corresponding to the first pattern of the electrode layer of the electroluminescent display panel according to claim 3.

8. The mask according to claim 7, comprising a first sub-mask and a second sub-mask, wherein
- the electrode layer of the electroluminescent display panel is a cathode layer;
- the cathode layer also serves as a touch electrode layer;
- the touch electrode layer comprises a plurality of sub-touch electrodes which are mutually spaced apart from each other and touch lead wires connected in one-to-one correspondence with the sub-touch electrodes;
- the first sub-mask comprises a plurality of block-shaped first openings arranged in an array;
- for the first openings in each row, the first openings have lengths in a column direction perpendicular to a row direction that are sequentially decreased from a central region to each of both sides of the row;
- the second sub-mask comprises groups of second openings arranged in a plurality of rows and two columns, and each group of second openings comprises a plurality of second openings each of which is in a strip shape;
- the second openings in each group have sequentially increased lengths in the column direction;
- when the second sub-mask is aligned with the first sub-mask, an orthographic projection of each of the groups of second openings of the second sub-mask, on the first sub-mask, is located in a gap between two adjacent rows of first openings of the first sub-mask;
- the orthographic projection of each of the groups of second openings, on the first sub-mask, is in contact with corresponding ones of the first openings of the first sub-mask; and
- a combination of the first openings and the second openings constitutes a pattern corresponding to the sub-touch electrodes and a pattern corresponding to the touch lead wires, each of the touch lead wires being connected to a corresponding one of the sub-touch electrodes.

9. The mask according to claim 8, wherein
- at least a portion of the first openings in a central region of the first sub-mask are first standard openings, the first standard openings comprise the at least a portion of the first openings which are adjacent and symmetric to each other in a central region of the first sub-mask, and remaining first openings other than the first standard openings are first compensatory openings; and
- each of the first compensatory openings is provided with a first compensatory region at an end of the first compensatory opening proximal to a next row of first openings, a pattern formed by each of the first compensatory openings and a corresponding one of the first compensatory regions is the same as a pattern formed by each of the first standard openings, and each of the first compensatory regions is a region having a reduced thickness.

10. The mask according to claim 9, wherein
- for each group of second openings, a second opening that is closest to a group of second openings in a next column is a second standard opening, and remaining second openings other than the second standard opening are second compensatory openings;
- each of the second compensatory openings is provided with a second compensatory region at an end of the second compensatory opening proximal to a next column of second openings;
- a pattern formed by each of the second compensatory openings and a corresponding second compensatory region is the same as a pattern formed by each of the second standard openings; and
- each of the second compensatory regions is a region having a reduced thickness.

11. The mask according to claim 10, wherein
- each of the first compensatory regions has a thickness that is half a thickness of the first sub-mask; and
- each of the second compensatory regions has a thickness that is half a thickness of the second sub-mask.

* * * * *